United States Patent
Hamada et al.

(10) Patent No.: US 11,557,712 B2
(45) Date of Patent: Jan. 17, 2023

(54) VIBRATION GENERATING DEVICE AND ELECTRONIC EQUIPMENT

(71) Applicant: TAIYO YUDEN CO., LTD., Tokyo (JP)

(72) Inventors: Hiroshi Hamada, Takasaki (JP); Yukihiro Matsui, Takasaki (JP); Fumihisa Ito, Takasaki (JP); Takashi Tomita, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 764 days.

(21) Appl. No.: 16/277,783

(22) Filed: Feb. 15, 2019

(65) Prior Publication Data

US 2019/0267535 A1    Aug. 29, 2019

(30) Foreign Application Priority Data

Feb. 28, 2018   (JP) .............................. JP2018-034443

(51) Int. Cl.
*H01L 41/09*    (2006.01)
*H01L 41/27*    (2013.01)
*H01L 41/047*   (2006.01)

(52) U.S. Cl.
CPC ...... *H01L 41/0926* (2013.01); *H01L 41/0471* (2013.01); *H01L 41/0472* (2013.01); *H01L 41/27* (2013.01)

(58) Field of Classification Search
CPC .. H01L 41/0926; H01L 41/0471; H01L 41/27
See application file for complete search history.

(56) References Cited

U.S. PATENT DOCUMENTS

| | | | |
|---|---|---|---|
| 9,119,003 B2 | 8/2015 | Fukuoka et al. | |
| 9,883,289 B2 | 1/2018 | Kushima et al. | |
| 2009/0142209 A1* | 6/2009 | Hirata | H01L 41/083 417/413.2 |
| 2013/0242702 A1* | 9/2013 | Onishi | H04R 1/403 310/345 |

(Continued)

FOREIGN PATENT DOCUMENTS

| | | |
|---|---|---|
| CN | 103262576 A | 8/2013 |
| CN | 105375900 A | 3/2016 |

(Continued)

OTHER PUBLICATIONS

A First Office Action issued by the State Intellectual Property Office of China dated Oct. 30, 2020 for Chinese counterpart application No. 201910154934.3 (7 pages).

(Continued)

*Primary Examiner* — Bryan P Gordon
(74) *Attorney, Agent, or Firm* — Law Office of Katsuhiro Arai

(57) ABSTRACT

A vibration generating device 10 includes: a diaphragm 11; and a first piezoelectric actuator 12 and a second piezoelectric actuator 13 attached on an upper surface 11a and a lower surface 11b of the diaphragm 11, respectively, so as to sandwich the diaphragm 11 therebetween in a vicinity of an end surface of the diaphragm 11, wherein, in a top view of the upper surface 11a of the diaphragm 11, the first piezoelectric actuator 12 is disposed at a position shifted with respect to the second piezoelectric actuator 13.

5 Claims, 5 Drawing Sheets

(56) References Cited

U.S. PATENT DOCUMENTS

| | | | |
|---|---|---|---|
| 2015/0131821 A1* | 5/2015 | Iwasaki | H01L 41/0973 |
| | | | 381/190 |
| 2015/0146892 A1 | 5/2015 | Watanabe | |
| 2015/0222976 A1* | 8/2015 | de Bock | H01L 41/042 |
| | | | 29/854 |
| 2016/0052020 A1 | 2/2016 | Park et al. | |
| 2016/0087188 A1* | 3/2016 | Chao | G01S 15/8925 |
| | | | 257/254 |

FOREIGN PATENT DOCUMENTS

| | | | |
|---|---|---|---|
| JP | 2013243609 A | 12/2013 | |
| JP | 2014123812 A | 7/2014 | |
| JP | 5815833 B2 | 11/2015 | |
| JP | 2016046803 A | 4/2016 | |
| WO | 2012086180 A1 | 6/2012 | |
| WO | 2014024736 A1 | 2/2014 | |

OTHER PUBLICATIONS

A Notice of Reasons for Refusal issued by the Japanese Patent Office, dated Sep. 14, 2021, for Japanese counterpart application No. 2018-034443. (3 pages).

A Second Office Action issued by the State Intellectual Property Office of China dated Jul. 5, 2021, for Chinese counterpart application No. 201910154934.3 (7 pages).

* cited by examiner

[FIG. 1]
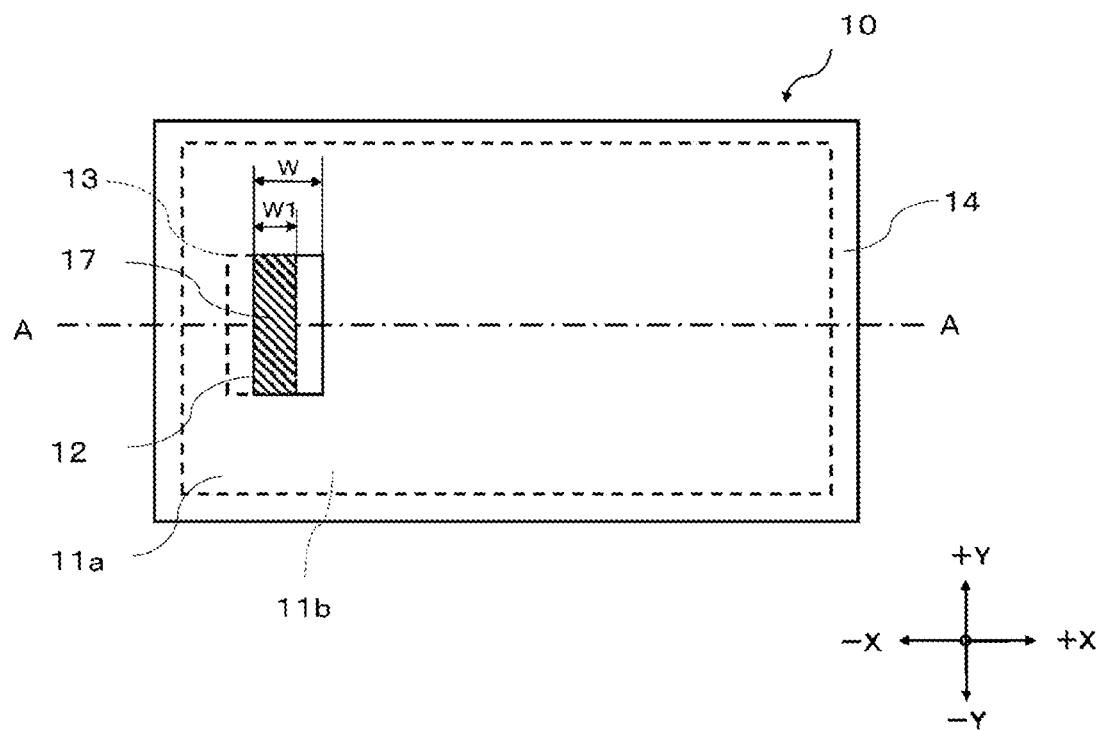

[FIG. 2]
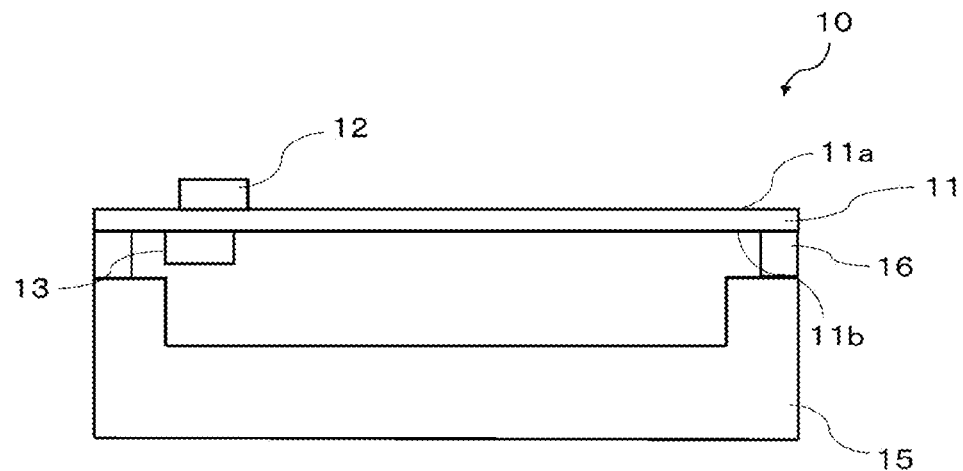
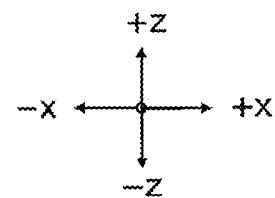
[FIG. 3]
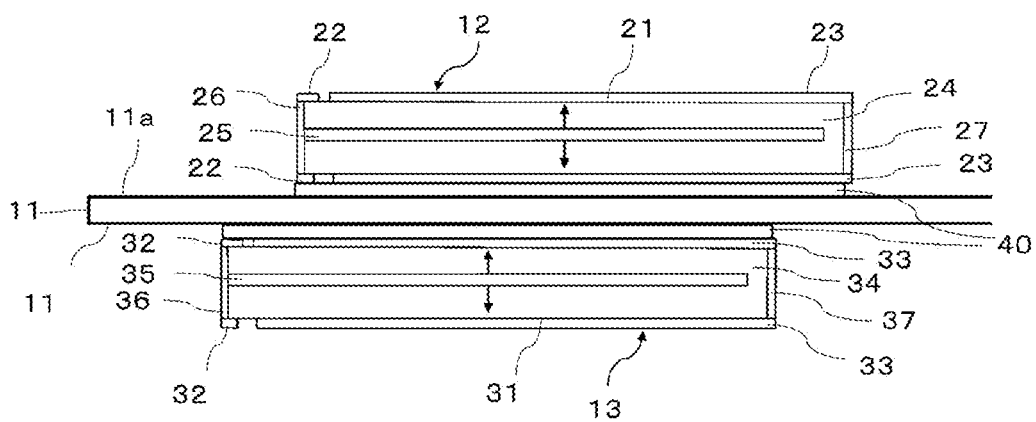
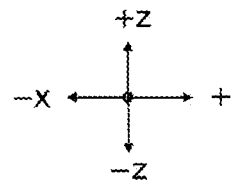

[FIG. 4]
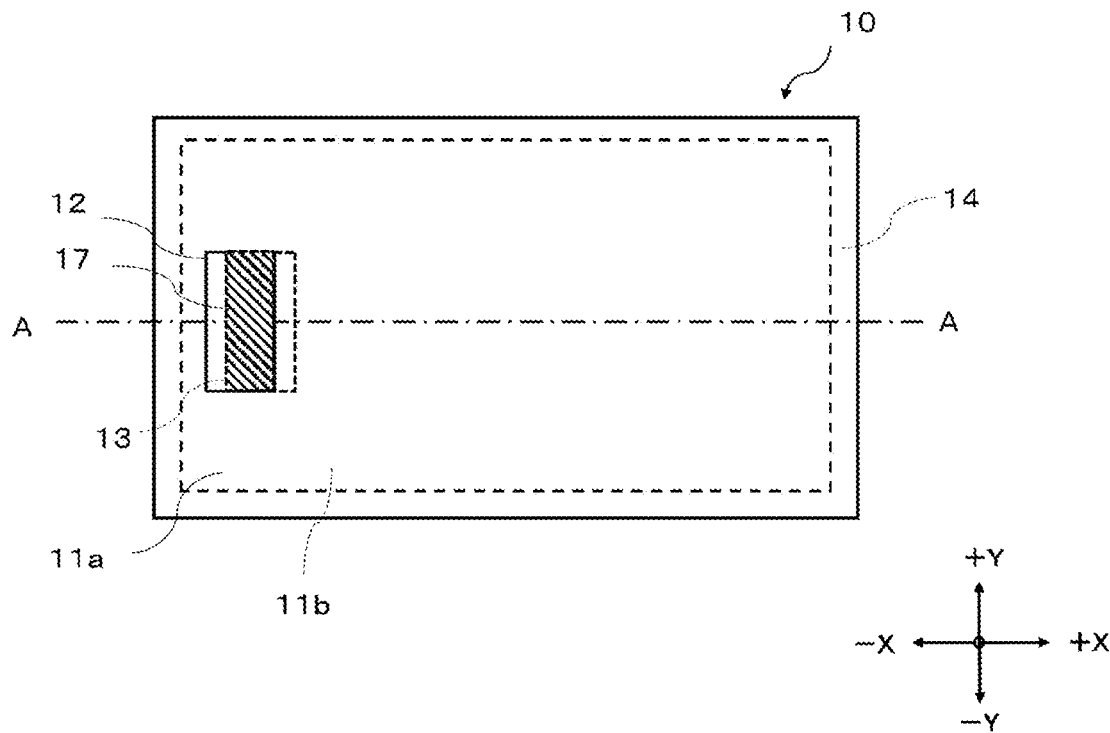
[FIG. 5]
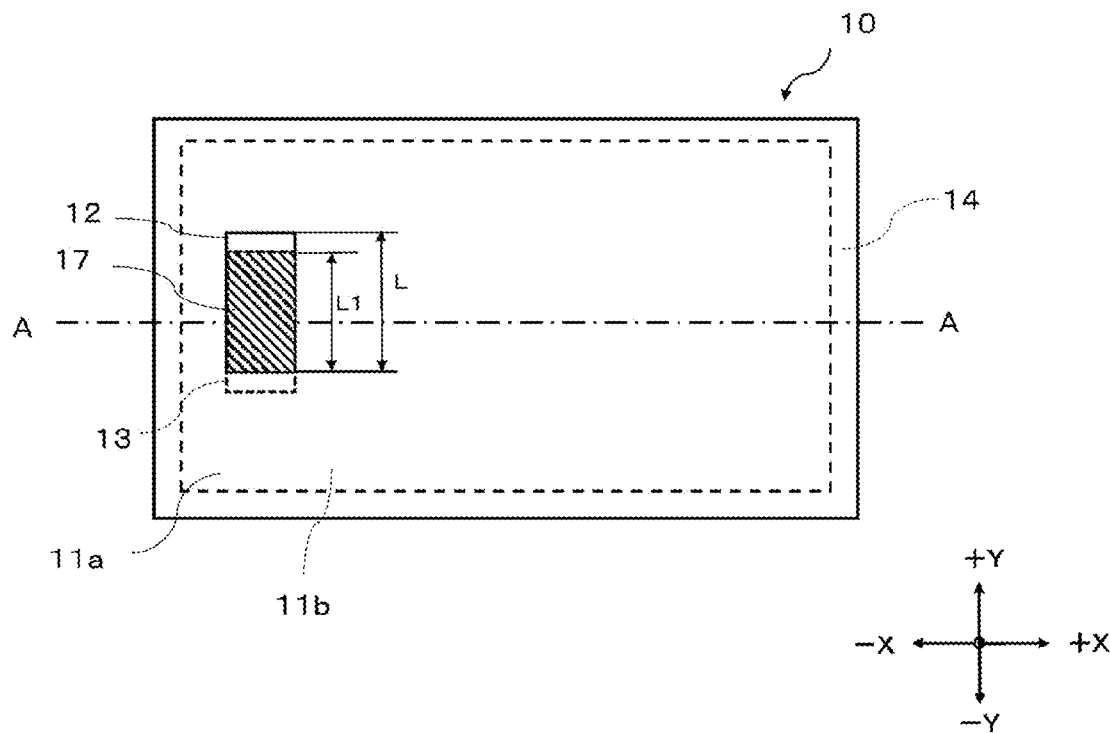

[FIG. 6]
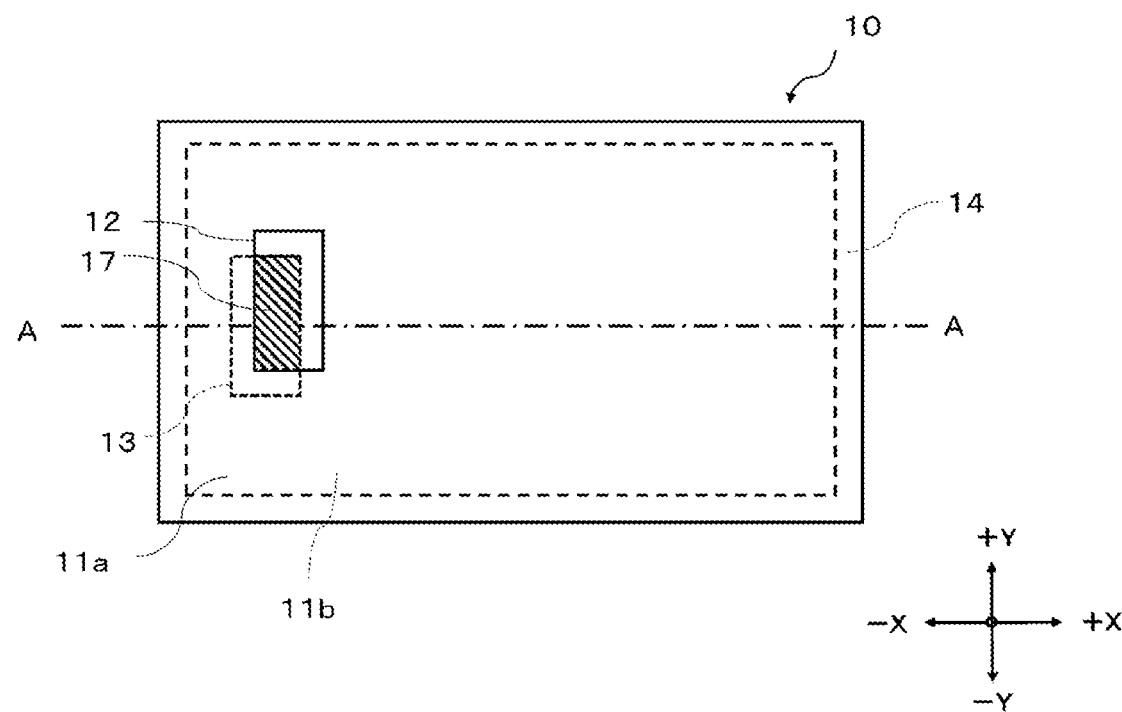
[FIG. 7]
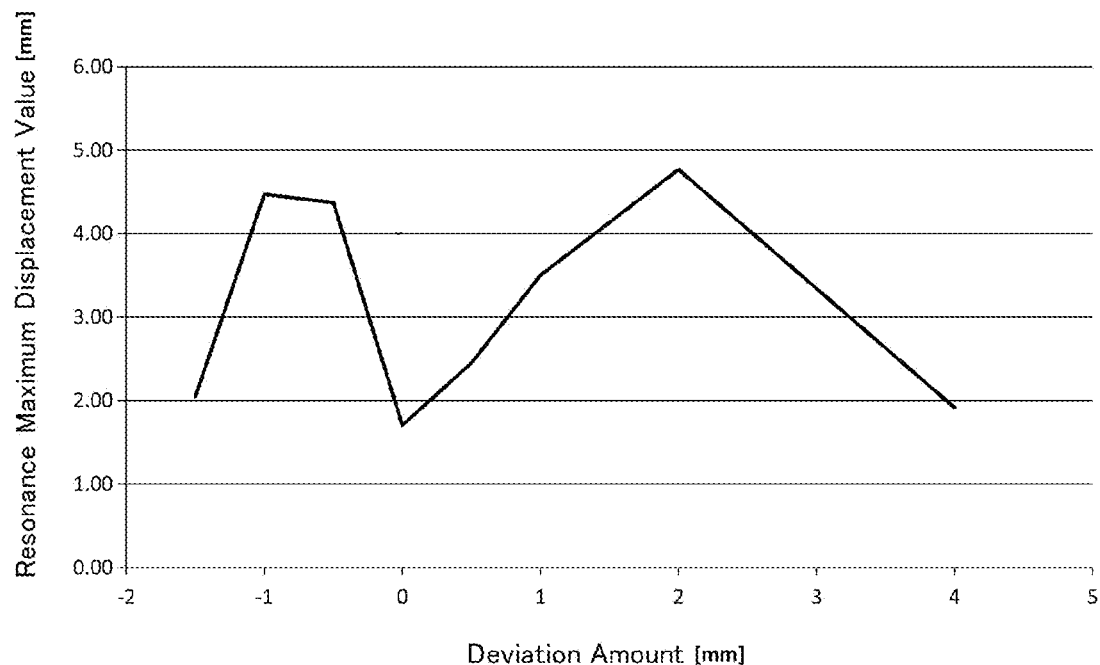

[FIG. 8]
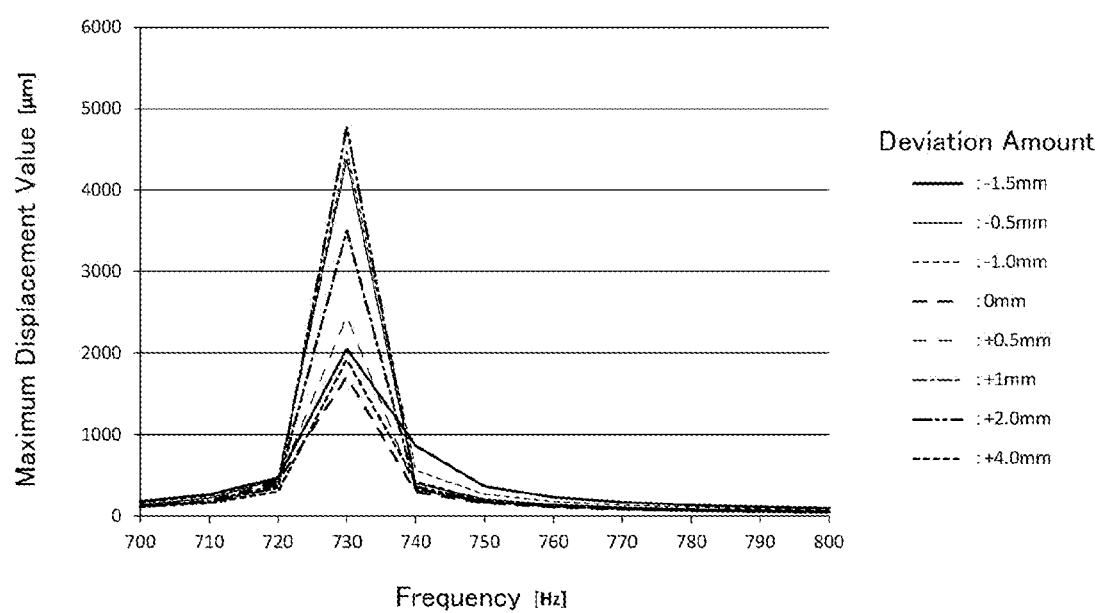

VIBRATION GENERATING DEVICE AND ELECTRONIC EQUIPMENT

TECHNICAL FIELD

The present invention relates to a vibration generating device and an electronic equipment.

BACKGROUND ART

In equipment such as a mobile phone and a tablet, a vibrating function become widely common to let a user know incoming calls or operating conditions of the equipment through vibration. In recent years, with miniaturization and thinning of the equipment, a vibrator is also required to be miniaturized, made thinner, and reduced in power consumption. For example, there is known a vibrator using a piezoelectric actuator in a unimorph type, in which a piezoelectric element is attached to an elastic plate, as a vibration source. There is also known a vibrator using a piezoelectric actuator in a bimorph type, in which an elastic plate is sandwiched between two piezoelectric elements so that one piezoelectric element contracts while the other piezoelectric element expands. A piezoelectric actuator in a bimorph type can easily obtain a displacement amount larger than a piezoelectric actuator in a unimorph type. On the other hand, since the piezoelectric actuator in a bimorph type utilizes bending mode of piezoelectric layers, there is a problem that a response frequency is limited.

In order to improve frequency characteristics, various ideas have been devised in electronic equipment using a plurality of piezoelectric actuators. For example, Patent Literature 1 discloses a sound generator in which a plurality of piezoelectric elements different from each other in thicknesses are attached to a main surface of a diaphragm at intervals. According to this sound generator, it is possible to reduce peak and dip in frequency characteristics of sound pressure.

In addition, Patent Literature 2 discloses a sound generator in which a plurality of piezoelectric elements are attached to a vibrating body so as to be asymmetric in a top view. Furthermore, Patent Literature 3 discloses a sound generator in which at least one side of an outline of an exciter and a side of an outline of a vibrating body facing the at least one side are not parallel to each other in a top view of the vibrating body. According to these sound generators, it is possible to obtain satisfactory frequency characteristics of sound pressure.

However, Patent Literatures 1 to 3 disclose the inventions in which piezoelectric actuators are two-dimensionally disposed, and a technique enabling a high displacement amount in a wide frequency range in a vibration generating device using a piezoelectric actuator in a bimorph type is not reported.

CITATION LIST

Patent Literature

[Patent Literature 1] Japanese Patent No. 5815833
[Patent Literature 2] International Publication No. WO2014/024736
[Patent Literature 3] Japanese Unexamined Patent Application Publication No. 2014-123812

SUMMARY OF INVENTION

Technical Problem

The present invention has been made in view of the above circumstances, and the present invention is to provide a vibration generating device and an electronic equipment capable of obtaining a high maximum displacement amount in a wide frequency range.

Solution to Problem

As a result of intensive studies, the inventors have found that it is possible to obtain a high maximum displacement amount in a wide frequency range by daringly shifting positions of two piezoelectric elements in a bimorph type, and then the present invention has been accomplished.

A vibration generating device according to a first aspect of the present invention includes: a diaphragm; and a first piezoelectric actuator and a second piezoelectric actuator attached on an upper surface and a lower surface of the diaphragm, respectively, so as to sandwich the diaphragm therebetween in a vicinity of an end surface of the diaphragm, wherein, in a top view of the upper surface of the diaphragm, the first piezoelectric actuator is disposed at a position shifted with respect to the second piezoelectric actuator.

In a top view of the upper surface of the diaphragm, the first piezoelectric actuator may be disposed at a position parallelly shifted to a direction away from the end surface along a width direction of the first piezoelectric actuator with respect to the second piezoelectric actuator. Preferably, the first piezoelectric actuator and the second piezoelectric actuator may overlap with each other in a range of 62% to 88% of a length of the first piezoelectric actuator in the width direction. More preferably, the first piezoelectric actuator and the second piezoelectric actuator may overlap with each other in a range of 70% to 80% of a length of the first piezoelectric actuator in the width direction.

In a top view of the upper surface of the diaphragm, the first piezoelectric actuator may be disposed at a position parallel shifted approaching the end surface in a width direction of the first piezoelectric actuator with respect to the second piezoelectric actuator. Preferably, the first piezoelectric actuator and the second piezoelectric actuator may overlap with each other in a range of 87.5% to 93.8% of the first piezoelectric actuator in the width direction length.

An electronic equipment according to a second aspect of the present invention includes: a vibration generating device according to the first aspect; an electronic circuit electrically connected to the vibration generating device; and a housing receiving the vibration generating device and the electronic circuit.

Advantageous Effects of Invention

According to the present invention, it is possible to provide a vibration generating device and an electronic equipment capable of obtaining a high maximum displacement amount in a wide frequency range.

BRIEF DESCRIPTION OF DRAWINGS

FIG. 1 is a schematic plan view showing a vibration generating device according to an embodiment of the present invention;

FIG. 2 is a sectional view taken along a line A-A in FIG. 1;

FIG. 3 is an enlarged cross-sectional view of a part to which piezoelectric actuators of the vibration generating device according to the embodiment is attached;

FIG. 4 is a schematic plan view showing another example in disposing the first piezoelectric actuator and the second piezoelectric actuator;

FIG. 5 is a schematic plan view showing still another example in disposing the first piezoelectric actuator and the second piezoelectric actuator;

FIG. 6 is a schematic plan view showing still another example in disposing the first piezoelectric actuator and the second piezoelectric actuator;

FIG. 7 is a graph showing a relation between a deviation amount of the first piezoelectric actuator and a resonance maximum displacement value with respect to the second piezoelectric actuator; and FIG. 8 is a graph showing a relation between a response frequency and a maximum displacement value.

DESCRIPTION OF EMBODIMENTS

Hereinafter, a vibration generating device and an electronic equipment according to an embodiment of the present invention is described with reference to the accompanying drawings.

[Vibration Generating Device]

As shown in FIGS. 1 and 2, a vibration generating device 10 according to an embodiment of the present invention includes a diaphragm 11, a piezoelectric actuator 12 attached on an upper surface 11a of the diaphragm 11 in a vicinity of an end surface of the diaphragm 11, and a second piezoelectric actuator 13 attached on a lower surface 11b of the diaphragm 11 in the vicinity of an end surface of the diaphragm 11. Here, "vicinity" means an area within 30 mm from the end surface of the diaphragm 11. The first piezoelectric actuator 12 and the second piezoelectric actuator 13 are the same. In addition, the first piezoelectric actuator 12 and the second piezoelectric actuator 13 are attached on the upper surface and the lower surface of the diaphragm 11, respectively, so as to sandwich the diaphragm 11 therebetween. The first piezoelectric actuator 12 and the second piezoelectric actuator 13 performs stretching vibration in a direction parallel to the upper surface 11a of the diaphragm 11 by applying electric signals. Two of the first piezoelectric actuators 12 and the second piezoelectric actuators 13 are disposed so that the stretching vibration directions thereof substantially match each other.

As shown in FIG. 2, the diaphragm 11 attached with the first piezoelectric actuator 12 and the second piezoelectric actuator 13 is fixed to a housing 15 in rectangle shape (see FIG. 2), for example, with the lower surface 11b of a peripheral portion 14 via a fixing portion 16.

As shown in FIG. 1, in the vibration generating device 10, the first piezoelectric actuator 12 is disposed at a position parallelly shifted to a direction (a +(plus)X-direction) away from the end surface of the diaphragm 11 along a width direction (a X-direction in FIG. 1) of the first piezoelectric actuator 12 with respect to the second piezoelectric actuator 13 in a top view of the upper surface 11a of the diaphragm 11. A region 17 where the first piezoelectric actuator 12 and the second piezoelectric actuator 13 overlap with each other is shown by a hatched region in the figure. From the viewpoint of increasing the resonance maximum displacement value, it is preferable that the first piezoelectric actuator 12 and the second piezoelectric actuator 13 overlap with each other in a range of 62% to 88% (W1 in FIG. 1) of a length (W in FIG. 1) of the first piezoelectric actuator 12 in the width direction. Further, it is more preferable that the first piezoelectric actuator 12 and the second piezoelectric actuator 13 overlap with each other in a range of 70 to 80% (W1 in FIG. 1) of the length W in the width direction.

(Piezoelectric Actuator)

As shown in FIG. 1, the first piezoelectric actuator 12 has a rectangular shape in a top view. As shown in FIG. 3, the first piezoelectric actuator 12 includes a laminated body 21 formed by alternately laminating two layers of piezoelectric layer 24 and one layer of internal electrode 25, external electrodes 22, 23 formed on an upper surface and a lower surface of the laminated body 21, and a pair of connection electrodes 26, 27 respectively provided at both end portions of the laminated body 21 in a longitudinal direction (the X-direction). The connection electrode 26 of the first piezoelectric actuator 12 is connected to the external electrode 22 and the internal electrode 25.

The piezoelectric layer 24 of the first piezoelectric actuator 12 is alternately polarized in a thickness direction (a Z-direction) of the piezoelectric layer 24 as indicated by arrows in FIG. 3. The piezoelectric layer 24 is configured to apply voltage to the connection electrodes 36, 37 in such a manner that, when the piezoelectric layer 24 of the first piezoelectric actuator 12 disposed on the upper surface 11a of the diaphragm 11 contracts, the piezoelectric layer 34 of the second piezoelectric actuator 13 disposed on the lower surface 11b of the diaphragm 11 expands.

The external electrode 22 of the first piezoelectric actuator 12 is formed at a predetermined interval so as not to get in contact with the external electrode 23 as a counter electrode formed on a surface of the laminated body 21. The same applies to the second piezoelectric actuator 13.

In the present embodiment, the first piezoelectric actuator 12 and the second piezoelectric actuator 13 are adhered to the vibration plate 11 with an adhesive 40. Example of the adhesive 40 may include epoxy resin, silicone resin, polyester resin and the like. In addition to the adhesive 40, the first piezoelectric actuator 12 and the second piezoelectric actuator 13 may be attached to the diaphragm 11 with a double-sided tape or the like.

It is preferable that the first piezoelectric actuator 12 and the second piezoelectric actuator 13 have a piezoelectric constant d31 of 180 pm/V or more in piezoelectric characteristics in order to induce bending flexural vibration largely.

—Piezoelectric Layer—

The piezoelectric layers 24 and 34 are preferably formed of a ceramic piezoelectric material such as $PbZr_xTi_{1-x}O_3$ (PZT), for example. Besides, it may also be made of a lead-free ceramic piezoelectric body containing no lead. The piezoelectric layer 24 has preferably a thickness of 100 μm to 500 μm, for example.

—Internal Electrode—

The internal electrodes 25 and 35 are formed of, for example, silver (Ag) or silver-palladium (Ag—Pd) alloy. In particular, in the present embodiment, it is preferable that the internal electrodes 25 and 35 are rich in silver content. The internal electrodes 25 and 35 has preferably a silver content of 50% by mass or more.

—Connection Electrode—

Examples of a forming material of the connection electrodes 26, 27, 36 and 37 may include silver, a silver compound containing glass composed mainly of silica into silver, nickel or the like as with the external electrodes 22, 23, 32 and 33.

—External Electrode—

Examples of a forming material of the external electrodes 22, 23, 32 and 33 may include silver, a silver compound composed mainly of silica into silver, nickel or the like.

—Piezoelectric Actuator Manufacturing Method—

The piezoelectric actuator according to the present embodiment may be obtained, for example, by preparing a slurry through mixing material powder of the piezoelectric layers 24, 34 with an organic solvent, a binder, a plasticizer, a dispersant and the like at a predetermined ratio, making ceramic green sheets with a doctor blade method as known or the like, laminating the ceramic green sheets on the internal electrodes 25, 35 and the external electrodes 22, 23, 32, 33, removing the binder at 500° C. in the atmosphere, and then integrally firing at 1000° C. in the atmosphere. Not limited to the doctor blade method, the piezoelectric actuator may also be obtained in another way, for example, by alternately printing and laminating a slurry containing material powder of the piezoelectric layers 24, 34 and a conductive paste containing an electrode material with a so-called slurry build method, and then integrally firing them.

(Diaphragm)

The diaphragm 11 is an object to be vibrated by the first piezoelectric actuator and the second piezoelectric actuator and is a member in rectangle shape having a predetermined thickness. The material of the diaphragm 11 is not particularly limited, and it is configured to include glass, metal, resin, a composite material of metal and resin, or the like. For example, in a case of an electronic equipment or the like having a liquid crystal panel, a cover glass on the liquid crystal panel may be employed as the diaphragm, and the cover glass is fixed to a housing of the electronic equipment.

The housing 15 in rectangle shape may be formed of stainless steel having a thickness of 100 to 1000 μm, for example. A material of the housing 15 is not limited to stainless steel, and any material may be employed as long as it is hard to be deformed as compared with resin. Examples of such material may include hard resin, plastic, engineering plastic, ceramics and the like. However, it is not particularly limited thereto in material and thickness. A shape of the housing is not limited to a rectangular shape and it may be a polygonal shape.

In the above embodiment, it has been described that the first piezoelectric actuator 12 is disposed at a position parallelly shifted to the direction (the +X-direction) away from the end surface of the diaphragm 11 along the width direction of the first piezoelectric actuator 12 with respect to the second piezoelectric actuator 13. However, as shown in FIG. 4, the first piezoelectric actuator 12 may also be disposed at a position parallelly shifted to a direction (a −(minus)X-direction) approaching the end surface of the diaphragm along the width direction (the X-direction) of the first piezoelectric actuator 12 with respect to the second piezoelectric actuator 13.

Further, in the above embodiment, it has been described that the first piezoelectric actuator 12 is disposed at a position parallelly shifted along the width direction (the X-direction) of the first piezoelectric actuator 12 with respect to the second piezoelectric actuator 13. However, as shown in FIG. 5, the first piezoelectric actuator 12 may also be disposed at a position parallelly shifted along a longitudinal direction (a Y-direction) of the first piezoelectric actuator 12. In this case, it may be shifted to either a +(plus)Y-direction or a −(minus)Y-direction.

When a length of the first piezoelectric actuator 12 in the longitudinal direction (the Y-direction) is represented by L and a length in which the piezoelectric actuators overlap with each other in the longitudinal direction (the Y-direction) is represented by L1, the length L1 is set in such a manner that a relation in a top view between an area 'a' of the first piezoelectric actuator 12 and an area 'b' of the region 17 where the first piezoelectric actuator 12 and the second piezoelectric actuator 13 overlap with each other is preferably made to satisfy a range of $0.5 \leq b/a \leq 0.88$.

Further, as shown in FIG. 6, the first piezoelectric actuator 12 may be disposed at a position shifted along an oblique direction. The oblique direction is not limited to an upper right direction shown in FIG. 6, but it may be any direction such as a lower right direction, an upper left direction and a lower left direction in the figure. When the first piezoelectric actuator 12 is shifted to the oblique direction, a relation in a top view between the area 'a' of the first piezoelectric actuator 12 and the area 'b' of the region 17 where the first piezoelectric actuator 12 and the second piezoelectric actuator 13 overlap with each other is also preferably made to satisfy a range of $0.5 \leq b/a \leq 0.88$.

In the above embodiment in which the first piezoelectric actuator 12 is parallelly shifted along the X-direction, the preferable range of the position where the first piezoelectric actuator 12 is shifted is the width direction of the element of the first piezoelectric actuator 12 and the second piezoelectric actuator 13. However, a relation in a top view between the area 'a' of the first piezoelectric actuator and the area 'b' of the region 17 where the first piezoelectric actuator 12 and the second piezoelectric actuator 13 overlap with each other is also preferably made to satisfy $0.5 \leq b/a \leq 0.88$.

[Electronic Equipment]

An electronic equipment according to the present embodiment includes the vibration generating device 10, an electronic circuit electrically connected to the vibration generating device 10, a housing receiving the vibration generating device 10 and the electronic circuit. Examples of the electronic equipment include a thin electronic equipment, a mobile electronic equipment, etc. The vibration generating device of the present embodiment functions as a vibrator of such electronic equipment. The electronic equipment may be a controller of a game machine, a wearable device, a tablet terminal, a portable music player or the like. Further, the electronic equipment may be embodied as an in-vehicle electronic equipment. Furthermore, the electronic equipment may be embodied as a household electronic equipment (a television, a vacuum cleaner, a washing machine, a refrigerator, a microwave oven, etc.).

EXAMPLES

Frequency characteristics of the vibration generating device according to the present embodiment were verified. Specifically, a simulation of resonance maximum displacement value in a frequency range of 700 Hz to 800 Hz was performed by using a frequency response analysis with a finite element method for vibration generating devices in which the first piezoelectric actuator 12 was disposed at positions parallelly shifted to the X-direction by 0 mm, −0.5 mm, −1.0 mm, −1.5 mm, +0.5 mm, +1.0 mm, +2.0 mm, +4.0 mm, respectively. The +X-direction is a direction away from the end surface of the diaphragm 11, and the −X-direction is a direction approaching the end surface of the diaphragm 11. The simulation was performed under the following conditions.

<Simulation Conditions>

Material of the diaphragm: soda glass;
Size of the diaphragm: 100×70×thickness 0.5 (mm);
Size of the piezoelectric actuators: 53×8×thickness 0.3 (mm);
Attaching position of the second piezoelectric actuator (a distance from an end of the second piezoelectric actuator in a longitudinal direction to the end surface of the diaphragm): 2 mm;
Fixing of the piezoelectric actuators to the diaphragm: epoxy resin in thickness of 5 μm; and
Outer periphery of the diaphragm: constrained as a whole.

A relation between a deviation amount and the resonance maximum displacement value is shown in FIG. 7, and the frequency characteristics of the maximum displacement value are shown in FIG. 8.

As shown in FIG. 7, the resonance maximum displacement value was about 1.8 mm in a case where the first piezoelectric actuator 12 and the second piezoelectric actuator 13 exactly overlap with each other (the deviation amount=0 mm) in a top view. Whereas, as understood, the resonance maximum displacement value was increased by shifting the position of the first piezoelectric actuator 12 along the width direction of the first piezoelectric actuator 12.

Further, as shown in FIG. 8, in the vibration generating device according to the present embodiment, the maximum displacement values in the frequency range of 720 Hz to 740 Hz were obtained as with the case of the displacement amount of 0 mm. In the vibration generating device according to the present embodiment, it is possible to obtain a high displacement value in the same frequency range as a vibration generating device (the deviation amount=0 mm) in a conventional bimorph type.

REFERENCE SIGNS LIST

10 . . . vibration generating device;
11 . . . diaphragm;
11a . . . upper surface;
11b . . . lower surface;
12 . . . first piezoelectric actuator;
13 . . . second piezoelectric actuator;
14 . . . peripheral portion;
15 . . . housing in rectangle shape;
16 . . . fixing portion;
17 . . . region where the first piezoelectric actuator and the second piezoelectric actuator overlap with each other;
21, 31 . . . laminated body;
22, 23, 32, 33 . . . external electrode;
24, 34 . . . piezoelectric layer;
25, 35 . . . internal electrode;
26, 27, 36, 37 . . . connection electrode; and
40 . . . adhesive.

The invention claimed is:

1. A vibration generating device comprising:
a diaphragm that has a rectangular shape in a top view and of which material is glass; and
a first piezoelectric actuator and a second piezoelectric actuator that have a rectangular shape in a top view and are attached on an upper surface and a lower surface of the diaphragm, respectively, so as to sandwich the diaphragm therebetween in a vicinity of an end surface of the diaphragm,
wherein,
the first piezoelectric actuator and the second piezoelectric actuator are disposed with a length in a longitudinal direction in parallel to the end surface of the diaphragm,
in a top view of the upper surface of the diaphragm, the first piezoelectric actuator is disposed at a position shifted with respect to the second piezoelectric actuator,
a relation between an area A of the first piezoelectric actuator and an area B of a region where the first piezoelectric actuator and the second piezoelectric actuator overlap with each other in a top view satisfies $0.5 \leq B/A \leq 0.88$,
in a top view of the upper surface of the diaphragm, the first piezoelectric actuator is disposed at a position parallelly shifted to a direction away from the end surface along a width direction of the first piezoelectric actuator with respect to the second piezoelectric actuator, and
the first piezoelectric actuator and the second piezoelectric actuator overlap with each other in a range of 62% to 88% of a length of the first piezoelectric actuator in the width direction.

2. The vibration generating device according to claim 1, wherein the first piezoelectric actuator and the second piezoelectric actuator overlap with each other in a range of 70% to 80% of the length of the first piezoelectric actuator in the width direction.

3. A vibration generating device comprising:
a diaphragm that has a rectangular shape in a top view and of which material is glass; and
a first piezoelectric actuator and a second piezoelectric actuator that have a rectangular shape in a top view and are attached on an upper surface and a lower surface of the diaphragm, respectively, so as to sandwich the diaphragm therebetween in a vicinity of an end surface of the diaphragm,
wherein,
the first piezoelectric actuator and the second piezoelectric actuator are disposed with a length in a longitudinal direction in parallel to the end surface of the diaphragm,
in a top view of the upper surface of the diaphragm, the first piezoelectric actuator is disposed at a position shifted with respect to the second piezoelectric actuator,
a relation between an area A of the first piezoelectric actuator and an area B of a region where the first piezoelectric actuator and the second piezoelectric actuator overlap with each other in a top view satisfies $0.5 \leq B/A \leq 0.88$,
in a top view of the upper surface of the diaphragm, the first piezoelectric actuator is disposed at a position parallelly shifted to a direction approaching the end surface along a width direction of the first piezoelectric actuator with respect to the second piezoelectric actuator, and
the first piezoelectric actuator and the second piezoelectric actuator overlap with each other in a range of 87.5% to 93.8% of the first piezoelectric actuator in the width direction length.

4. An electronic equipment comprising:
a vibration generating device according to claim 1;
an electronic circuit electrically connected to the vibration generating device; and
a housing receiving the vibration generating device and the electronic circuit.

5. An electronic equipment comprising:
a vibration generating device according to claim 3;
an electronic circuit electrically connected to the vibration generating device; and
a housing receiving the vibration generating device and the electronic circuit.

\* \* \* \* \*